United States Patent
House et al.

(10) Patent No.: US 6,628,852 B2
(45) Date of Patent: Sep. 30, 2003

(54) ISOLATION DEVICE

(75) Inventors: Andrew Alan House, Summertown (GB); Ian Edward Day, Headington (GB); George Frederick Hopper, Maidenhead (GB)

(73) Assignee: Bookham Technology PLC, Abingdon (GB)

( * ) Notice: Subject to any disclaimer, the term of this patent is extended or adjusted under 35 U.S.C. 154(b) by 29 days.

(21) Appl. No.: 09/850,060

(22) Filed: May 8, 2001

(65) Prior Publication Data

US 2002/0126939 A1 Sep. 12, 2002

(30) Foreign Application Priority Data

Sep. 21, 2000 (GB) .............................................. 0023133

(51) Int. Cl.$^7$ ............................. G02B 6/12; G02B 6/10; H01L 29/00

(52) U.S. Cl. ........................ 385/14; 385/130; 385/140; 257/544

(58) Field of Search ................... 385/2, 14, 8, 130–132, 385/140; 257/432, 350, 347, 544, 548

(56) References Cited

U.S. PATENT DOCUMENTS 4,997,246 A * 3/1991 May et al. .................... 385/2
5,280,189 A * 1/1994 Schuppert et al. .......... 257/458

* cited by examiner

*Primary Examiner*—Hemang Sanghavi
*Assistant Examiner*—Omar Rojas
(74) *Attorney, Agent, or Firm*—Fleshner & Kim, LLP

(57) ABSTRACT

An isolation device that can be used for providing optical and electrical isolation between areas of an integrated chip. The isolation device includes three doped elongate regions which form diodes which can be connected in series. The isolation device can be used in optical devices or optical attenuators.

15 Claims, 2 Drawing Sheets

ISOLATION DEVICE

FIELD OF THE INVENTION

This invention relates to an isolation device for providing optical and electrical isolation between areas of an integrated optical circuit.

BACKGROUND OF THE INVENTION

It is known to isolate two optically conductive areas of an integrated optical circuit from each other by providing a trench between the two areas. If the trench is empty, optical isolation is provided by reflection of stray light at the interface between the optically conductive area and the trench. It is preferable instead to absorb the stray light by filling the trench with light absorbent material. However, this may have a tendency of reducing the electrical isolation between the two optically conductive areas.

It is also known to absorb stray light by providing dopant in selected areas of an optical chip, e.g. as described in WO-A-99/28772, the disclosure of which is incorporated herein.

SUMMARY OF THE INVENTION

This invention aims to provide an alternative form of device which provides both optical and electrical isolation.

According to the invention, there is provided an isolation device for providing optical and electrical isolation between areas of an integrated optical chip comprising a first elongate region doped with a first dopant material, a second elongate region on one side of the first elongate region and a third elongate region on the opposite side of the first elongate region, the second and third elongate regions being doped with a second dopant material of opposite polarity to the first dopant material so a first diode is formed between the second and first elongate regions and a second diode is formed between the first and third elongate regions, the first and second diodes being connected in series with opposing polarity.

BRIEF DESCRIPTION OF THE DRAWINGS

The invention will be described in detail with reference to the following drawings in which like reference numerals refer to like elements wherein.

The invention will now be further described, merely by way of example, with reference to the accompanying drawings, in which.

DETAILED DESCRIPTION OF PREFERRED EMBODIMENTS

Figure 1:
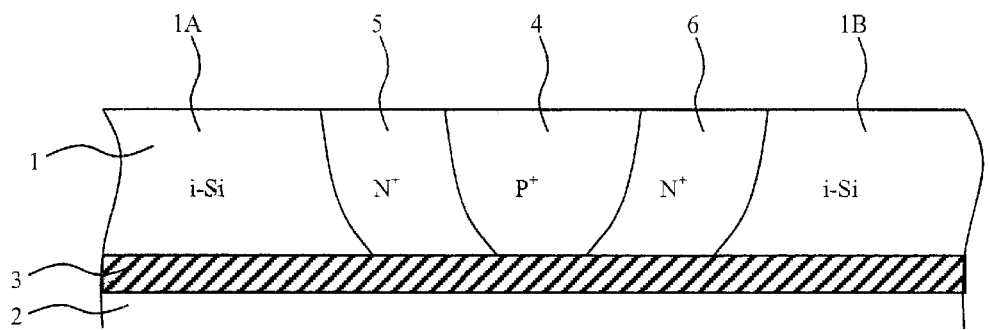
FIG. 1 is a schematic cross-sectional view through a device according to one embodiment of the invention.
Figure 2:
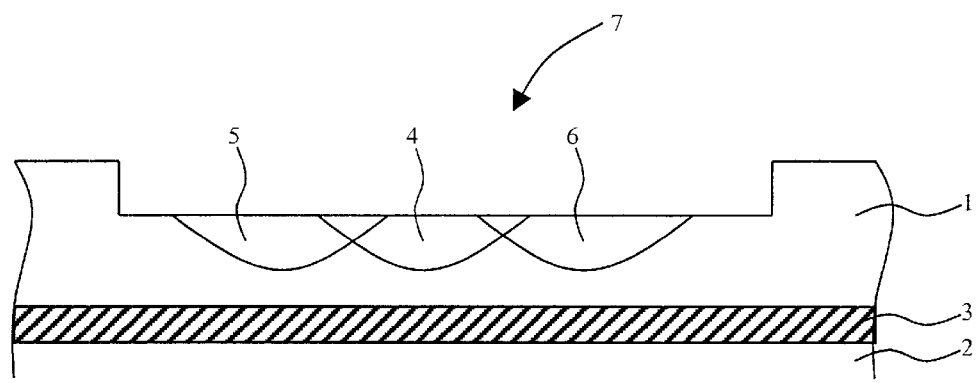
FIG. 2 is a schematic cross-sectional view through a device according to another embodiment of the invention.

FIGS. 1 and 2 show devices comprising an n-p-n junction formed in the silicon layer of a silicon-on-insulator (SOI) chip comprises a layer of silicon 1, separated from a substrate 2 (which may also be of silicon) by an insulating layer 3, e.g. of silicon dioxide.

The silicon layer 1 is nominally intrinsic, i.e. with no n or p doping, although in practice it tends to contain a very small amount of p-dopant. FIG. 1 shows first and second areas 1A and 1B of the silicon layer 1 which are separated by an n-p-n junction comprising an elongate p-doped region 4, a first elongate n-doped region 5 on one side thereof and a second elongate p-doped region 6 on the opposite side thereof. The regions 4 and 5 thus form a first pn junction and the regions 4 and 6 form a second pn junction, the two pn junctions being connected in series (by the common p-doped region 4) with opposing polarity. It will be appreciated that current may flow through a forward biased pn junction but not through a reverse biased pn junction. Thus, even if an electrical potential exists between the first area 1A and the second area 1B, no current can flow therebetween through the regions 4, 5 and 6 as this potential will reverse bias one of the pn junctions. The n-p-n junction thus electrically isolates the first area 1A from the second area 1B. Furthermore, the dopant provided within the regions 4, 5 and 6 absorbs stray light attempting to pass either from area 1A to area 1B or vice versa. The n-p-n junction thus also effectively optically isolates the area 1A from the area 1B.

As shown in FIG. 1, the p-doped region 4 and the n-doped regions 5 and 6 preferably extend down to the oxide layer 3 (which is electrically non-conductive) so there is no undoped silicon path extending from area 1A to area 1B.

The doped regions 4, 5 and 6 may be fabricated by a variety of known methods involving ion implantation and/or diffusing in of dopant and may take forms other than those shown in FIG. 1. Each of the n-doped regions 5 and 6 is shown contiguous with the p-doped region 4 so there is no undoped silicon area therebetween. Alternatively, the adjacent regions may overlap to some extent (as shown in FIG. 2). Such arrangements are suitable where the applied voltage is relatively low and a compact layout is required.

FIG. 2 shows an alternative form of device in which a trench 7 is first etched in the silicon layer 1 prior to formation of the n-p-n junctions. The layer of silicon remaining at the base of the trench 7 is thus shallower so making it easier to form the doped region 4, 5 and 6 through to the oxide layer 3.

FIG. 2 shows a thin silicon layer remaining beneath the doped regions 4, 5 and 6 but, as indicated above, the doped regions 4, 5 and 6 preferably extend through the entire depth of the silicon layer to the oxide layer 3.

In a typical SOI chip, the silicon layer 1 may have a thickness (from the surface of the chip to the oxide layer 3) of 4–8 microns. The trench 7 is preferably etched to a depth such as to leave a layer of silicon at the base thereof of a thickness of around 2.6 microns.

The trench 7 may be etched deeper, or a further trench etched at the base thereof, to reduce the thickness of silicon remaining further so long as the remaining layer of silicon has a sufficient thickness to enable the doped regions 4, 5 and 6 to be formed therein. However, in practice, the trench may be formed at the same time as other etched features on the chip, e.g. p-i-n diodes (see below), so will be subject to the minimum thickness requirements of these features, which might typically be 1 micron.

The depth of the trench 7, or the thickness of the silicon layer in which the n-p-n junction is formed, need not be in uniform across the device.

Figure 3:
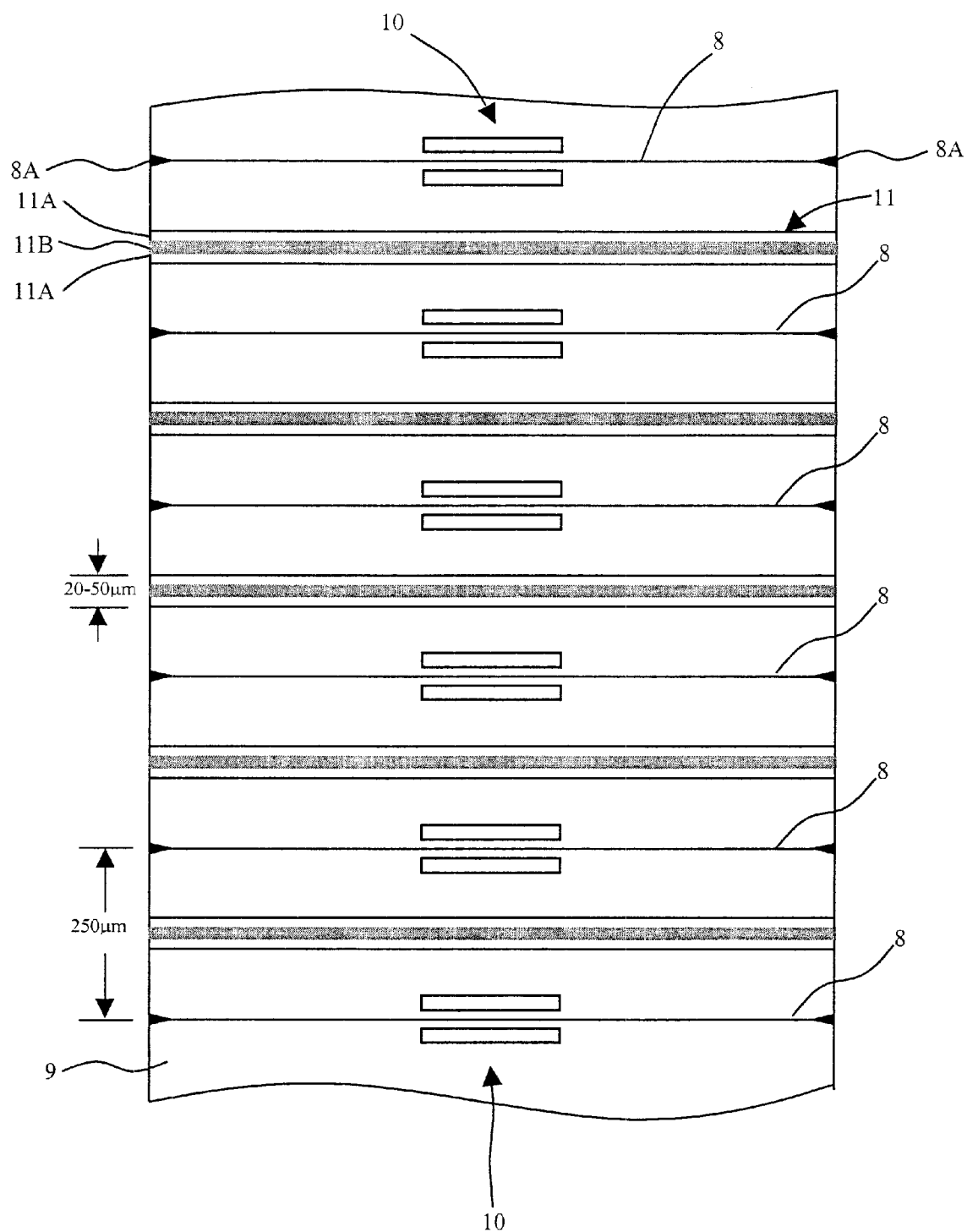
FIG. 3 is a schematic plan view of a variable optical attenuator incorporating devices such as shown in FIGS. 1 and 2.

An isolation device such as that described above, may be used to provide optical and electrical isolation between adjacent optical waveguides. For instance, a variable optical attenuator (VOA) may comprise 40 or more channels and comprise an array of rib waveguides formed in the silicon layer spaced from each other at a pitch of about 250 microns. FIG. 3 shows a plan view of part of such a VOA comprising a plurality of rib waveguides 8 extending across a chip 9. Tapered sections 8A are provided at each end of the waveguides to facilitate a low loss coupling with an optical fibre (not shown). The tapered sections 8A may, for instance, be as described in U.S. Pat. No. 6,108,478. Attenuation devices 10 are provided on each waveguide 8 to provide variable attenuation of the optical signal carried by the waveguide 8. The attenuation device may, for instance, comprise one or more p-i-n diode modulators, e.g. as described in U.S. Pat. No. 5757986 or co-pending application No GB0019771.5 (Publication No GB2367142A). Isolation devices 11 comprising n-p-n junctions as described above are provided between each pair of waveguides 8 to provide electrical and optical isolation between adjacent waveguides and their associated attenuation devices 10. The devices are shown as comprising n-doped regions 11A each side of a p-doped region 11B as described in relation to FIGS. 1 and 2.

Figure 4:
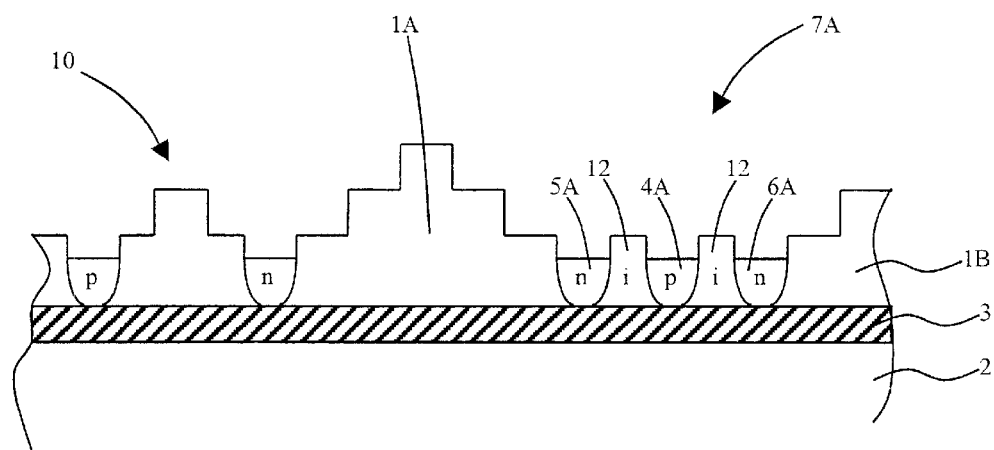
FIG. 4 is a schematic cross-sectional view through a device according to a further embodiment of the invention.

In a further embodiment, especially where the electrical isolation to high voltages is required, e.g., in excess of 50V, the p-type and n-type regions are preferably separated by a relatively undoped or intrinsic region. FIG. 4 shows such a form of device in which a trench 7A is first etched in the silicon layer 1, prior to formation of n and p-type regions, 5A, 6A and 4A, separated by intrinsic regions 12 so as to form a n-i-p-i-n junction. As previously indicated, the n and p-type doped regions preferably extend through the entire depth of the silicon layer to the oxide layer 3 to prevent any current leakage across the junction between the regions 1A and 1B. The n-i-p-i-n arrangement provides better reverse breakdown characteristics due to the shallower doping concentration gradient between the p and n-doped regions, due to the intrinsic regions 12 therebetween.

FIG. 4 also shows a cross-section through a p-i-n diode attenuator device 10, such as that described above, on one side of the n-i-p-i-n junction.

The provision of an isolation device such as that described above between adjacent waveguides can significantly reduce the cross-talk between the channels caused either by stray light passing from one waveguide to another or electrical signals applied to an attenuator 10 on one waveguide affecting the attenuators 10 on adjacent waveguides.

A device such as that shown in FIG. 1, FIG. 2 or FIG. 4, may, typically, have a width (i.e. the width of the n-p-n (or n-i-p-i-n) junction) in the range 20 microns to 50 microns. The n-p-n (or n-i-p-i-n) junction is formed by the elongate regions 4, 5 and 6 which extend a required distance across the optical device. In the example of a VOA mentioned above, they may, for instance, extend the entire length of the chip (as shown in FIG. 3), which may be a distance 20 mm or more.

It will be appreciated that a similar n-p-n (or n-i-p-i-n) junction may be formed in other types of chip to optically and electrically isolate one are from another, e.g. a III/V material system or other semiconductor material.

A p-n-p (or p-i-n-i-p) junction may be used in place of the n-p-n (or n-i-p-i-n) junctions described. If the nominally intrinsic silicon layer 1 were slightly n-doped, this would be preferred.

The p-type dopant may typically comprise boron provided at a dopant level of at least $10^{18}$ cm$^{-3}$, e.g., in the range of $10^{18}$ to $10^{20}$ cm$^{-3}$, or higher.

The n-type dopant may typically comprise phosphorous provided at a dopant level of at least $10^{18}$ cm$^{-3}$, e.g., in the range of $10^{18}$ to $10^{20}$ cm$^{-3}$, or higher.

What is claimed is:

1. An isolation device for providing optical and electrical isolation between areas of an integrated optical chip, comprising:

a first elongate region doped with a first dopant material;

a second elongate region on one side of the first elongate region; and a third elongate region on the opposite side of the first elongate region, wherein the second and third elongate regions are doped with a second dopant material of an opposite conductivity type to the first dopant material to form a first diode between the second and first elongate regions and a second diode between the first and third elongate regions, wherein the first and second diodes are connected in series with opposing conductivity types, and wherein the device is formed at the base of a trench, which in turn is formed in the surface of the optical chip.

2. An isolation device for providing optical and electrical isolation between areas of an integrated optical chip, comprising:

a first elongate region doped with a first dopant material;

a second elongate region on one side of the first elongate region; and a third elongate region on the opposite side of the first elongate region, wherein the second and third elongate regions are doped with a second dopant material of an opposite conductivity type to the first dopant material to form a first diode between the second and first elongate regions and a second diode between the first and third elongate regions, wherein the first and second diodes are connected in series with opposing conductivity types, in which the first elongate region is separated from both the second and third elongate regions by a relatively undoped region.

3. An isolation device for providing optical and electrical isolation between areas of an integrated optical chip, comprising:

a first elongate region doped with a first dopant material;

a second elongate region on one side of the first elongate region; and a third elongate region on the opposite side of the first elongate region, wherein the second and third elongate regions are doped with a second dopant material of an opposite conductivity type to the first dopant material to form a first diode between the second and first elongate regions and a second diode between the first and third elongate regions, wherein the first and second diodes are connected in series with opposing conductivity types, wherein the device is formed between two rib waveguides formed in a silicon layer.

4. A device as claimed in claims 1, 2, or 3, further comprising:

an electrically non-conductive layer; and an optically conductive layer formed over the electrically non-conductive layer, wherein the first, second and third elongate regions extend through the optically conductive layer to the electrically non-conductive layer.

5. A device as claimed in claims 2 or 3, wherein the device is formed at the base of a trench, which in turn is formed in the surface of the optical chip.

6. A device as claimed in claims 1 or 3, wherein the second, first and third elongate regions form an n-p-n junction.

7. A device as claimed in claims 1, 2 or 3, wherein the device is formed on a silicon-on-insulator chip comprising a layer of silicon separated from a substrate by a layer of insulating material.

8. The isolation device as claimed in claims 1, 2 or 3, wherein the width of the isolation device is about 20 to 50 microns.

9. The isolation device as claimed in claims 1, 2 or 3, wherein the first dopant material comprises boron and the second dopant material comprises phosphorous.

10. The isolation device as claimed in claims 1, 2 or 3, wherein the first and second dopant materials are provided at a dopant level of at least $10^{18}$ cm$^{-3}$.

11. A device as claimed in claims 1 or 2, wherein the device is formed between two rib waveguides formed in a silicon layer.

12. A device as claimed in claims 1 or 3, in which the first elongate region is separated from both the second and third elongate regions by a relatively undoped region.

13. An optical device, comprising:

an array of waveguides; and a plurality of isolation devices, comprising:
- a first elongate region doped with a first dopant material;
- a second elongate region on one side of the first elongate region; and
- a third elongate region on the opposite side of the first elongate region, wherein the second and third elongate regions are doped with a second dopant material of an opposite conductivity type to the first dopant material to form a first diode between the second and first elongate regions and a second diode between the first and third elongate regions, wherein the first and second diodes are connected in series with opposing conductivity types, wherein each of the plurality of isolation devices are positioned between adjacent waveguides.

14. A variable optical attenuator, comprising:

an array of rib waveguides formed in a silicon layer;

a plurality of attenuation devices on each waveguide; and a plurality of isolation devices, comprising:
- a first elongate region doped with a first dopant material;
- a second elongate region on one side of the first elongate region; and
- a third elongate region on the opposite side of the first elongate region, wherein the second and third elongate regions are doped with a second dopant material of an opposite conductivity type to the first dopant material to form a first diode between the second and first elongate regions and a second diode between the first and third elongate regions, wherein the first and second diodes are connected in series with opposing conductivity types, wherein each of the plurality of isolation devices are positioned between adjacent waveguides.

15. The variable optical attenuator as claimed in claim 14, further comprising a trench formed in a silicon layer, wherein the elongate regions are formed in the silicon layer.

* * * * *